United States Patent [19]

Greenberg

[11] 4,124,864
[45] Nov. 7, 1978

[54] PLASTIC ENCAPSULATED SEMICONDUCTOR DEVICES

[75] Inventor: Leon S. Greenberg, Bridgewater, N.J.

[73] Assignee: RCA Corporation, New York, N.Y.

[21] Appl. No.: 903,119

[22] Filed: May 5, 1978

Related U.S. Application Data

[63] Continuation of Ser. No. 788,330, Apr. 18, 1977, abandoned.

[51] Int. Cl.² ........................................... H01L 23/48
[52] U.S. Cl. ....................................... 357/70; 357/72; 357/80; 357/81
[58] Field of Search ..................... 357/70, 72, 80, 81

[56] References Cited

U.S. PATENT DOCUMENTS

| | | | |
|---|---|---|---|
| 3,820,153 | 6/1974 | Quinn | 357/81 |
| 3,969,752 | 7/1976 | Martin et al. | 357/80 |
| 4,023,198 | 5/1977 | Malone et al. | 357/81 |

Primary Examiner—Edward J. Wojciechowicz
Attorney, Agent, or Firm—H. Christoffersen; T. H. Magee

[57] ABSTRACT

A plastic packaged semiconductor device having a heat sink includes a semiconductor device which requires ultrasonically bonded leads. External leads are attached to the heat sink and have end portions to which ultrasonic bonds can be made. The lead end portions are separated from the heat sink by a body of insulating material. Preferably, the insulating material is an epoxy adhesive which may contain reinforcing glass fibers.

11 Claims, 8 Drawing Figures

PLASTIC ENCAPSULATED SEMICONDUCTOR DEVICES

This invention relates to plastic encapsulated semiconductor devices which are adapted to handle relatively large amounts of power. The device is particularly adapted for use with semiconductor pellets which are required to be joined to external leads by ultrasonic bonding.

One plastic semiconductor package which has been widely used for power transistors is known as the RCA "Versawatt" package, registered with the Electronic Industries Association under the designation TO-220. See also U.S. Pat. No. 3,478,420 to Grimes et al., assigned to RCA Corporation. The TO-220 package comprises a relatively massive heat sink plate on which a solder-metallized semiconductor pellet is placed in intimate thermal contact. In the assembly of the device, a lead frame is attached to the heat sink, usually by swaging, with leads in contact with the solder on the top surface of the pellet to hold the pellet in place on the heat sink plate. A solder preform is held between the pellet and the heat sink plate. The assembly is then heated to reflow the solder to secure the pellet to the heat sink and the leads to the top surface of the pellet. Thereafter, the pellet and parts of the leads are encapsulated in a body of moldable polymeric material in such a manner that a surface of the heat sink plate is not covered. Many semiconductor devices are known which are not adapted to be connected by means of solder, and thus cannot be packaged in a conventional TO-220 type package. These semiconductor devices are metallized with such materials as aluminum or trimetal systems (titanium, platinum, and gold) and these devices must be attached to external leads by means of intermediate wires which are either thermal compression bonded or ultrasonically bonded to the semiconductor device and the external leads.

Ultrasonic wire bonding is a popular technique, and has been used in packages which are similar in appearance to the TO-220 package. See, for example, Overman, U.S. Pat. No. 3,606,673, and Van de Water, U.S. Pat. No. 3,629,672. In making ultrasonic bonds, it is necessary for the surface to which the bond is made to be relatively rigidly held. This is necessary because the action of the bonding tool in this process is to rub the lead which is being attached against the attachment surface so as to create heat between the lead and the surface by means of friction. If the surface to which the lead is being attached can move, it will simply oscillate along with the lead, and bonding cannot be achieved.

In Overman, although an ultrasonic bond is disclosed as made to a lead, (See column 3, lines 62–65) there is no suggestion or disclosure in Overman as to how this may be accomplished with the freely extending unsupported leads shown in FIGS. 2 and 3, for example. Presumably, a temporary support is brought in under these leads at the time the ultrasonic bonds are made. This presumption is suggested by the Van de Water reference which also involves ultrasonic bonding and which provides recesses 17 (FIG. 4) for permitting a temporary support to be brought under the leads 3 and 4 during ultrasonic bonding. Similar supporting structure would be required to enable thermocompression bonding in these packages. Consequently, the packages disclosed by Overman and Van de Water require special tooling in order to achieve wire bonding. It would be desirable to achieve wire bonds in a package of this kind without such special tooling and the present package accomplished this result.

Figure 1:
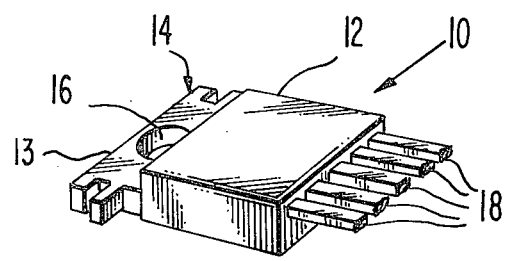
FIG. 1 is a perspective view of a five or six terminal embodiment of the present novel device.

The external appearance of one embodiment of the present device is illustrated at 10 in FIG. 1. A semiconductor chip is disposed within a body 12 of moldable polymeric material. Extending from one end of the body 12 of polymeric material is an end portion 13 of a heat sink plate 14 of electrically and thermally conductive material, which is provided with an aperture 16 for a fastener to secure the device 10 to an external heat sink. At the end of the body 12 opposite from the heat sink end portion 13 are a plurality of leads 18. The number of leads 18 is not critical and is determined by the number of external connections required by the particular chip housed within the package. The number of leads 18 is, of course, limited by the size of the package 12, the size being standard for a plurality of different semiconductor devices. Five leads are about the maximum which can be reasonably accommodated in this package, while maintaining the external dimensions of the conventional TO-220 package.

The present device is adapted to be assembled by gang techniques as is common for the fabrication of the TO-220 package. As is known in the art, this technique involves the use of a plurality of heat sink plates joined together in a strip, to which a lead frame is attached. See the Overman patent referred to above.

Figure 2:
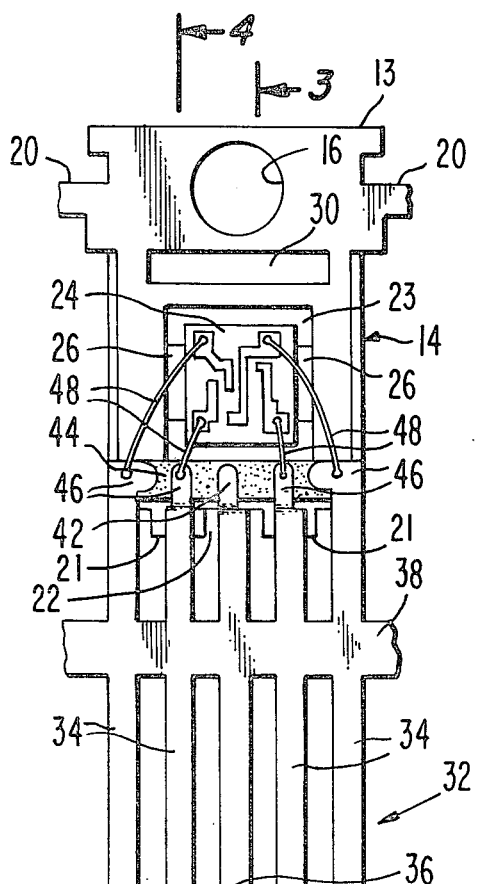
FIG. 2 is a partial plan view of one element of a multi-element intermediate assembly, showing the relationship of a lead frame, a heat sink, and a semiconductor chip.
Figure 3:
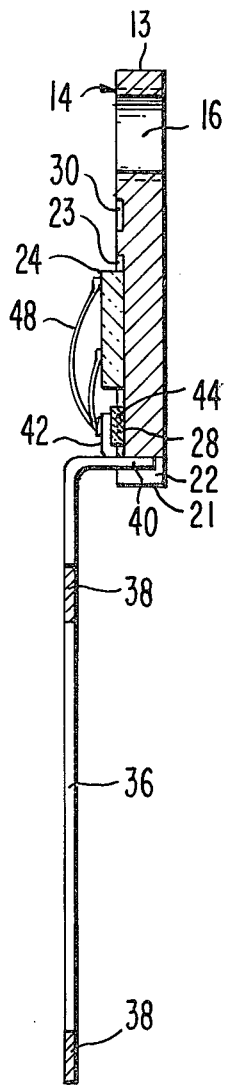
FIG. 3 is a section taken on the line 3—3 of FIG. 2.

One element of an intermediate assembly of the present device, shown prior to the molding of the polymeric body 12 thereon, is illustrated in FIG. 2. The heat sink plate 14 is shown with arms 20 (broken away) which connect the heat sink plate 14 shown to adjacent heat sink plates in a strip. At the end of the heat sink plate 14 which is opposite to the end portion 13 are a pair of projections 21 like those in a conventional TO-220 package. The projections 21 define between them a notch 22. The heat sink plate 14 is provided with recess 23 in which a semiconductor pellet 24 is disposed. Preferably, the configuration of the recess 23 is such that there are shoulders 26 adjacent two opposite sides thereof. The shoulders 26 are spaced from each other by a distance substantially equal to the width of the chip 24 and are designed to locate the chip 24 centrally of the recess 23. The recess 23 and the shoulders 26 may be formed by stamping processes, and the shoulders 26 may be slightly depressed from the top surface of the heat sink 14 as a result of this processing. The recess 23 also has a portion 28 (FIGS. 3 and 4) adjacent to the end of the heat sink plate 14 opposite from the end portion 13. The portion 28 of the recess 23 extends substantially across the heat sink plate 14 for a purpose to be described below.

So that the heat sink plate 14 can be standardized for use with several embodiments of the present device, the heat sink plate 14 also has another recess 30 disposed between the recess 23 and the aperture 16. This recess 30 is not used in the embodiment of FIG. 2, but is used in the embodiment of FIG. 6 as will be described below.

Attached to the heat sink plate 14 is a lead frame 32 comprising outside leads 34 and a central lead 36, totalling five leads in this embodiment. The leads 34 and 36 are joined in conventional manner by tie bars 38 which, later in the construction of the device, will be sheared off to separate the leads.

The central lead 36 of the lead frame 32 has a depending end portion 40 (FIG. 3) which is adapted to abut the end surface of the heat sink plate 14 in the notch 22 between the projections 21 thereon. This serves to align the lead frame 32 with the heat sink plate 14 in the initial assembly of these parts. The lead end portion 40 may be attached to the heat sink plate 14 by swaging as in TO-220 packages but this is not necessary in the present package. A tongue 42 is struck out of the end portion 40 of the central lead 36 and extends parallel to the upper surface of the heat sink plate 14. This tongue 42 is separated from but secured to the heat sink plate 14 by a body of electrically insulating material 44 disposed in the portion 28 of the recess 23 and extending substantially across the width of the heat sink plate 14. This body of electrically insulating material 44 comprises a resin having reinforcing fibers therein. Utilization of such a body 44 will allow the end portions 40 and 46 of the leads 36 and 34 to be pressed against the self-adhesive resin while the fibers simultaneously prevent the end portions 40 and 46 from shorting-through to the heat sink plate 14. In other words, the combined use of the resin together with reinforcing fibers provides a novel self-adhesive body which will adhere to both the end portions 40 and 46 and plate 14 while simultaneously maintaining a relatively small dielectric separation therebetween, which may be conveniently controlled by selecting fibers of appropriate diameter. Preferably, the body 44 is an epoxy resin adhesive reinforced by woven glass cloth or non-woven glass fibers. Epoxy resins are thermosetting, and once the lead frame 32, the body 44, and the heat sink plate are assembled and the epoxy cured, the body 44 will remain solid during further processing.

Figure 4:
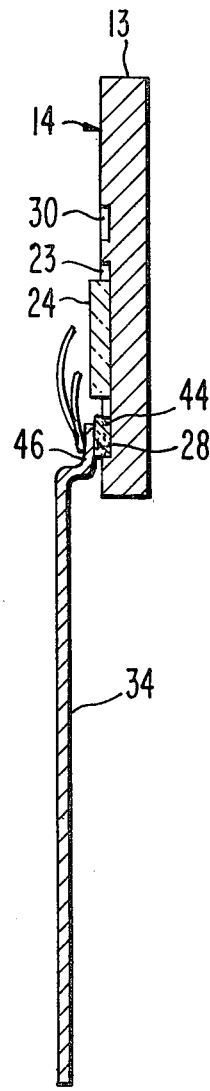
FIG. 4 is a section taken on the line 4—4 of FIG. 2.

The outside leads 34 of the lead frame 32 are provided with offset end portions 46 as shown particularly in FIG. 4. These end portions 46 of the outside leads 34 are insulatingly separated from and adhered to the heat sink plate 14 by means of the body of insulating material 44. Because of the adhesive qualities of the body 44, the end portions 46 and the tongue 42 are relatively rigidly secured to the heat sink plate 14 so as to permit wire bonding thereto.

Connected between the semiconductor chip 24 and the end portions 46 of the outside leads 34 are a plurality of conductors 48, e.g. wires, each of which is bonded at one of its ends to the semiconductor chip 24 and at its other end to the end portion 46 of an outside lead 34. In this embodiment, the center lead 36 is connected electrically to the heat sink plate 14 via the depending end portion 40 thereof and no connection is shown between the semiconductor chip 24 and the tongue 42 of this lead. However, such a connection may be required in some semiconductor devices and may be provided, inasmuch as the tongue 42 is also well supported for bonding. Although the present device is particularly adapted for connection by ultrasonic bonding, other methods such as thermocompression bonding may also be used.

After the attachment of the conductors 48 in the embodiment of FIG. 2, the device can be further processed to mold the body 12 of polymeric material around the semiconductor chip 24 and portions of the heat sink plate 14 and the leads 34 and 36. The tie bars 38 and the arms 20 are then removed to separate the devices into individual components, all in conventional manner.

Figure 5:
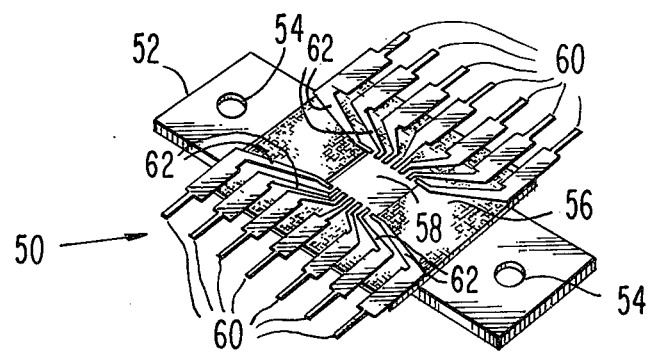
FIG. 5 is a perspective view of portions of another embodiment of the present novel device, particularly a 14 lead dual-in-line package.

FIG. 5 illustrates an intermediate assembly 50 adapted to be processed into another embodiment of the present novel structure, particularly one which requires a greater number of leads than are available in the TO-220 configuration. In this embodiment, there is a heat sink plate 52 which is generally elongated and provided with mounting apertures 54 at the ends thereof. On and secured to the surface of the heat sink 52 is a piece of epoxy impregnated fiberglass cloth 56 which has a central aperture 58 within which a semiconductor chip (not shown) may be thermally and electrically attached to the heat sink plate 52.

A lead frame assembly of conventional configuration, shown at 60, has inner lead portions 62 which are disposed on the cloth 56 and which are secured rigidly in place by the adhesive effect of the epoxy resin therein. The intermediate assembly 50 can be used with ultrasonic or other bonding techniques since all of the leads are rigidly supported. Conventional transfer molding and shearing techniques may be employed with this intermediate assembly 50.

Figure 6:
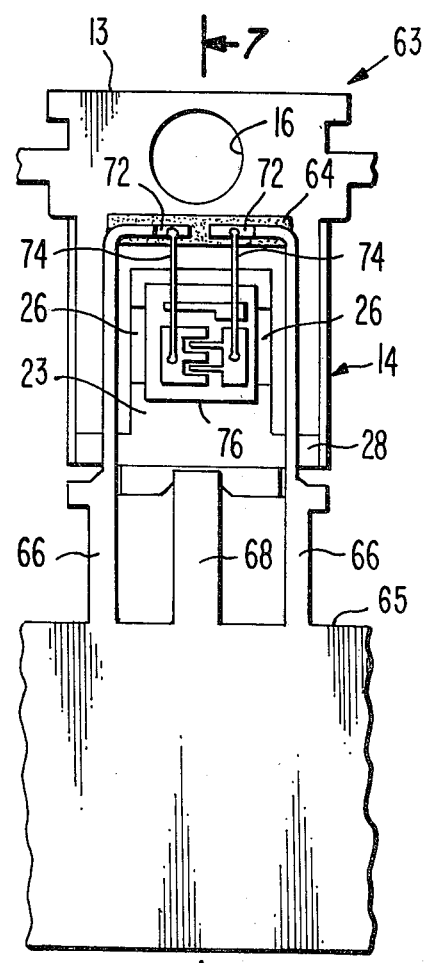
FIG. 6 is a partial plan view of an intermediate assembly similar to FIG. 2, but illustrating another embodiment of the present novel device.
Figure 7:
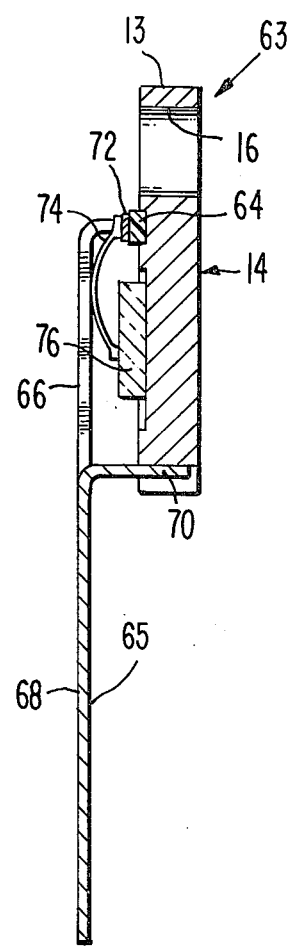
FIG. 7 is a section on the line 7—7 of FIG. 6.

Shown in FIGS. 6 and 7 is an intermediate assembly 63 useful in another embodiment of the present device. The assembly 63 utilizes the same kind of heat sink plate 14 as is used in the embodiment of FIG. 2 but in this case the recess 30 rather than the recess end portion 28 of the recess 22 is utilized to locate a body of insulating material 64 similar to the body 44 but configured to fit the recess 30. In this example, a lead frame 65 having three leads per device is employed. As shown, there are outside leads 66 and a central lead 68.

The central lead 68 has a depending end portion 70 (FIG. 7) which is adapted to be connected to the heat sink plate 14 in conventional manner, e.g. by swaging. The outside leads 66 are extended into overlying relation with the heat sink plate 14 and are shaped to have end portions 72 which are disposed on and adhered to the body 64 of insulating material. The end portions 72 are adapted to receive the ends of conductors 74 which extend between a semiconductor chip 76 and the end portions 72, similar to the conductors 48 of the embodiment of FIG. 2. A difference between this embodiment and the device shown in FIG. 2 is that the outside leads 66 extend a relatively long distance across the upper surface of the heat sink plate 14. These relatively long extensions become embedded in the polymeric encapsulation, thus providing a relatively rigid assembly with substantially less chance of the leads becoming loose owing to a break at the point of adherence between the leads and the epoxy material of the supporting and insulating body 64.

Figure 8:
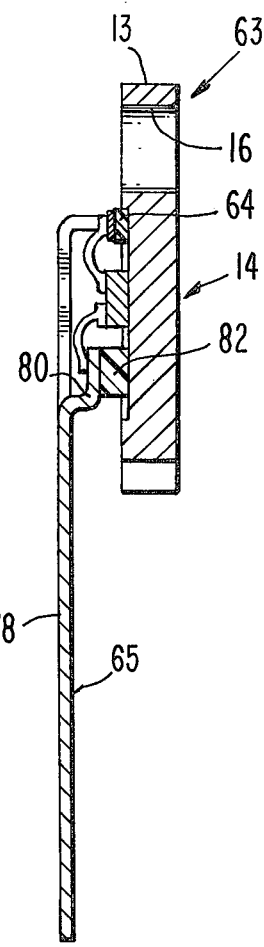
FIG. 8 is a partial cross-sectional view showing an alternative embodiment of the structure of the present device.

The assembly 63 can be thought of as a three lead assembly where the two outside leads 66 and the heat sink plate 14 together with the center lead 68 constitute the three conductors. If it is desired to have a four lead assembly, where all three leads 66 and 68 and the heat sink plate 14 act as separate leads, the assembly shown in cross section in FIG. 8 may be utilized. Here the central lead of the three, designated 78, has, instead of a depending end portion such as the portion 70 of the lead 68, an offset end portion 80 which, like the end portions 72 of the leads 66 of the assembly 63 can be attached to the heat sink plate 14 via an insulating body 82 similar to the insulating bodies 64 and 44.

In general, the present assemblies in which leads are attached to heat sink plates in insulated and rigid fashion, provide a device which can employ wire bonded semiconductor devices, such as most integrated circuits, for example, without requiring special tooling or handling procedures. The attachment of the leads to the heat sink plates via the adhesive insulating bodies can be readily accomplished by the ordinary skilled worker.

What is claimed is:

1. A semiconductor device comprising a plate of electrically and thermally conductive material adapted to support a semiconductor pellet,
   a plurality of leads each having an end portion adjacent to said plate, and
   a body of electrically insulating material lying between at least one of said end portions and said plate and adhered to said one end portion and said plate, said body comprising a resin having reinforcing fibers therein.

2. A semiconductor device as defined in claim 1 wherein said plate has a first recess for containing a body of electrically insulating material, said body of electrically insulating material being disposed in said recess.

3. A semiconductor device as defined in claim 1 wherein said plate has a notch at one end thereof, one of said leads having its end portion disposed and secured in said notch.

4. A semiconductor device as defined in claim 1 wherein said plate has a second recess therein adapted to receive a semiconductor pellet, and said plate also has an aperture therein at least one of said leads having a portion extending above and parallel to said plate over a substantial distance, said body of insulating material being located between said recess and said aperture.

5. A semiconductor device as defined in claim 4 further comprising a second body of insulating material on said plate at the side of said recess which is removed from said aperture, another of said lead end portions being supported by and adhered to said second body of insulating material.

6. A semiconductor device as defined in claim 1 wherein said body of electrically insulating material between a plurality of said end portions and said plate.

7. A semiconductor device as defined in claim 6 wherein said device further comprises
   a semiconductor pellet disposed on said plate in thermal contact therewith, and
   a plurality of conductors, one end of each conductor being bonded to said pellet and the other ends of said conductors being bonded to said end portions of said leads, respectively.

8. A semiconductor device as defined in claim 7 further comprising a body of moldable polymeric material on said plate in encapsulating relation to said pellet, said conductors and said end portions of said leads.

9. A semiconductor device as defined in claim 1 wherein said resin comprises an epoxy resin.

10. A semiconductor device as defined in claim 9 wherein said reinforcing fibers are non-woven glass fibers.

11. A semiconductor device as defined in claim 9 wherein said reinforcing fibers are woven glass cloth.

* * * * *

Disclaimer 4,124,864.—*Leon S. Greenberg*, Bridgewater, N.J. PLASTIC ENCAPSULATED SEMICONDUCTOR DEVICES. Patent dated Nov. 7, 1978. Disclaimer filed Nov. 25, 1980, by the assignee, *RCA Corporation*.

Hereby enters this disclaimer to claims 1, 6, 7, and 8 of said patent.

[*Official Gazette February 10, 1981.*]

Disclaimer 4,124,864.—*Leon Stanley Greenberg*, Bridgewater, N.J. PLASTIC ENCAPSULATED SEMICONDUCTOR DEVICES. Patent dated Nov. 7, 1978. Disclaimer filed May 25, 1984, by the assignee, *RCA Corp.*

Hereby enters this disclaimer to claims 9, 10 and 11 of said patent.

[*Official Gazette December 18, 1984.*]